United States Patent [19]

Tokuda et al.

[11] 4,258,311
[45] Mar. 24, 1981

[54] CONSTANT VOLTAGE GENERATOR FOR GENERATING A CONSTANT VOLTAGE HAVING A PREDETERMINED TEMPERATURE COEFFICIENT

[75] Inventors: Kazuo Tokuda; Hidetaro Watanabe; Yoshikazu Shimizu, all of Tokyo, Japan

[73] Assignee: Nippon Electric Co., Ltd., Tokyo, Japan

[21] Appl. No.: 971,136

[22] Filed: Dec. 19, 1978

[30] Foreign Application Priority Data

Dec. 19, 1977 [JP] Japan .................................. 52-153184

[51] Int. Cl.³ ...................... H01L 27/04; H01L 29/90
[52] U.S. Cl. ..................................... 323/313; 357/13; 357/28; 357/51; 323/907
[58] Field of Search ...................... 323/22 T, 22 Z, 19; 357/13, 28, 76, 51, 40; 307/237, 297, 302

[56] References Cited

U.S. PATENT DOCUMENTS

| | | | |
|---|---|---|---|
| 3,465,213 | 9/1969 | Hugle | 357/28 |
| 3,567,965 | 3/1971 | Weinerth et al. | 357/28 |

OTHER PUBLICATIONS

Berger et al., "Superintegrated Voltage Clamp", IEEE J. of Solid State Circuits, vol. SC8, No. 3, Jun. 1973, pp. 231-232.

*Primary Examiner*—William D. Larkins
*Attorney, Agent, or Firm*—Sughrue, Rothwell, Mion, Zinn and Macpeak

[57] ABSTRACT

A constant voltage generator capable of generating a constant voltage having a fixed temperature coefficient regardless of manufacturing errors is disclosed. The constant voltage generator comprises a transistor construction having a forwardly biased PN-junction, a Zener diode connected in series to an electrical path between the emitter and a collector of the transistor construction, a first resistor connected between a base and the emitter of the transistor construction, and a second resistor connected between the base and the collector of the transistor construction. The transistor construction, the Zener diode and the first and second resistors are all formed in a common semiconductor substrate, the first resistor being composed of a region of one conductivity type and the second resistor being composed of a pinch resistor formed in the substrate. The transistor and Zener diode may be composed of a first semiconductor region of one conductivity type, a second region of the other conductivity type formed in the first semiconductor region and a third region of the one conductivity type being formed in the second region. The first region may be composed of a fourth region of the other conductivity type formed in the first semiconductor region, and the second resistor may be composed of a fifth region of the other conductivity type formed in the first semiconductor region and operable as a resistive region and a sixth region of the one conductivity type covering a part of the fifth region.

5 Claims, 7 Drawing Figures

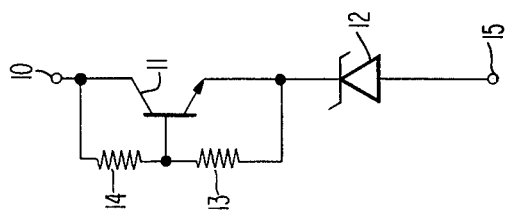
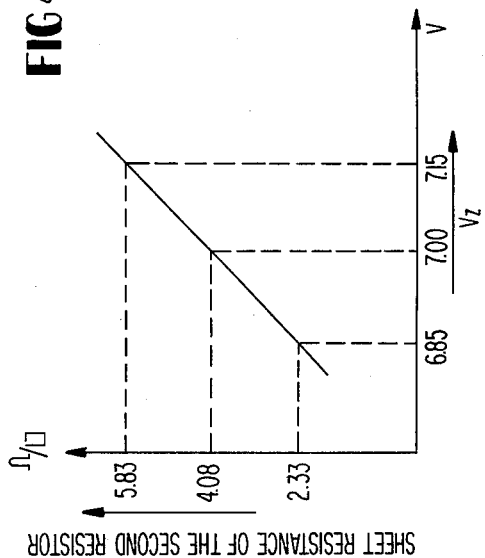
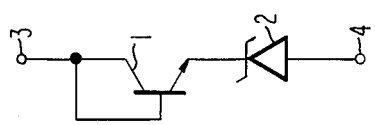
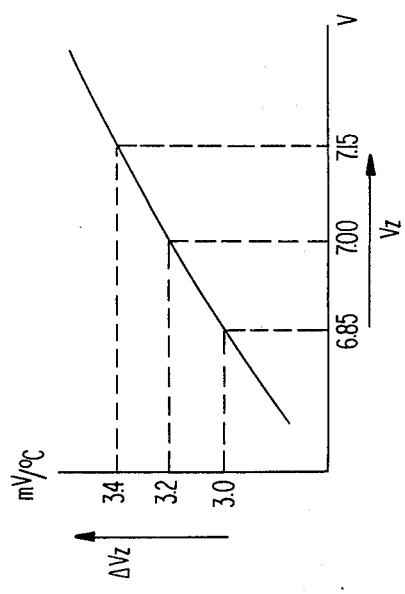

CONSTANT VOLTAGE GENERATOR FOR GENERATING A CONSTANT VOLTAGE HAVING A PREDETERMINED TEMPERATURE COEFFICIENT

BACKGROUND OF THE INVENTION

The present invention relates to a constant voltage generator and more particularly, to a constant voltage generator which is free from variation in a temperature coefficient caused by manufacturing errors, or deviation in manufacturing conditions, of a semiconductor integrated circuit and which is suitable for a semiconductor integrated circuit.

As constant voltage generators, those employing a constant voltage attainable upon forwardly biasing a PN-junction and those employing a breakdown voltage of a PN-junction, that is, employing the so-called Zener diode, are known. In every such constant voltage generator, the attainable constant voltage has temperature dependency. Particularly, those employing a forwardly biased PN-junction have a negative temperature coefficient, and those employing a breakdown voltage have a positive temperature coefficient. Consequently, for the purpose of obtaining a constant voltage free from temperature dependency, it has been proposed to serially connect the above-described respective types of constant voltage generators.

However, since a temperature coefficient has its value varied depending upon an impurity concentration, diffusion depth, etc., even if a series circuit of a forwardly biased PN-junction and a Zener diode have such sizes, depths and impurity concentrations of their respective diffusion regions designed in a manner that the overall temperature coefficient may become zero, the predetermined depths and impurity concentration of the diffusion regions cannot be obtained due to errors in the manufacturing steps or deviation in manufacturing conditions, and therefore, the temperature coefficients of the respective elements are varied, resulting in the disadvantage that a temperature coefficient arises in the overall constant voltage.

Since such variation in a temperature coefficient cannot be corrected once a semiconductor integrated circuit has been manufactured, such integrated circuits are compelled to be rejected. Therefore, there was a disadvantage that a production yield of semiconductor integrated circuits necessitating a constant voltage was low.

SUMMARY OF THE INVENTION

It is one object of the present invention to provide a constant voltage generator which can generate a constant voltage having a fixed temperature coefficient regardless of manufacturing errors.

According to one feature of the present invention, there is provided a constant voltage generator comprising a transistor construction having at least one forwardly biased PN-junction, a Zener diode connected in series to an electrical path between the emitter and the collector of the transistor construction, a first resistor connected between a base and the emitter of the transistor construction, and a second resistor connected between the base and the collector of the transistor construction, wherein the transistor construction and the Zener diode are formed in a semiconductor substrate, the first resistor being composed of a region of one conductivity type in the substrate and the second resistor being composed of a pinch resistor formed in the substrate. The transistor and the Zener diode may be composed of a first semiconductor region of one conduction type, a second region of the other conductivity type formed in the first semiconductor region and a third region of the one conductivity type being formed in the second region, and the first resistor may be composed of a fourth region of the other conductivity type formed in the first semiconductor region, and the second resistor may be composed of a fifth region of the other conductivity type formed in the first semiconductor region and operable as a resistive region and a sixth region of the one conductivity type covering a part of the fifth region.

In the case where the second region and the fifth region are formed in the same diffusion step and the third region and the sixth region are formed in the same diffusion step, there exists a proportional relationship between the breakdown voltage of the Zener diode and the resistance value of the second resistor. Also, depending upon the diffusion conditions, there exists a proportional relationship between the breakdown voltage of the Zener diode and its temperature coefficient. However, a temperature coefficient of a constant voltage obtained by the forwardly biased PN junction is not significantly varied depending upon a diffusion condition. Accordingly, if this not significantly varying temperature coefficent is enlarged by means of the first and second resistors so that the amount of variation of that temperature coefficient may be equalized to the amount of variation of the temperature coefficient of the Zener diode breakdown voltage, then the temperature coefficient of the constant voltage value can be kept constant even under variation of the manufacturing conditions, because these temperature coefficents have opposite polarities to each other. According to the present invention the temperature coefficient of the forwardly biased PN junction is enlarged by means of the first and second resistors, so that the enlarged temperature coefficient may be equalized to the temperature coefficient of the Zener diode breakdown voltage. Since there exists a proportional relationship between the Zener diode breakdown voltage and the resistance value of the second resistor, this equalized condition would not vary even if the diffusion condition should be varied, and thus the constant voltage generator according to the present invention can always generate a constant voltage having a fixed temperature coefficient regardless of manufacturing errors. As the manufacturing conditions can be widely mitigated in the above-described manner, a production yield of constant voltage generators is also enhanced.

BRIEF DESCRIPTION OF THE DRAWINGS

The above and other objects and features of the invention will become apparent from the following description taken in conjunction with the accompanying drawings, wherein:

FIG. 1 is a circuit diagram showing a conventional constant voltage generator formed in a semiconductor integrated circuit;

FIG. 2 is a diagram showing a relation between a breakdown voltage $V_z$ of a Zener diode and its temperature coefficient $\Delta V_z$;

FIG. 3 is a circuit diagram showing a first preferred embodiment of the present invention;

FIG. 4 is a diagram showing a relation between a breakdown voltage $V_z$ of the Zener diode and the sheet resistance of the second diffusion resistor of the first embodiment;

DESCRIPTION OF THE PRIOR ART

Figure 5:
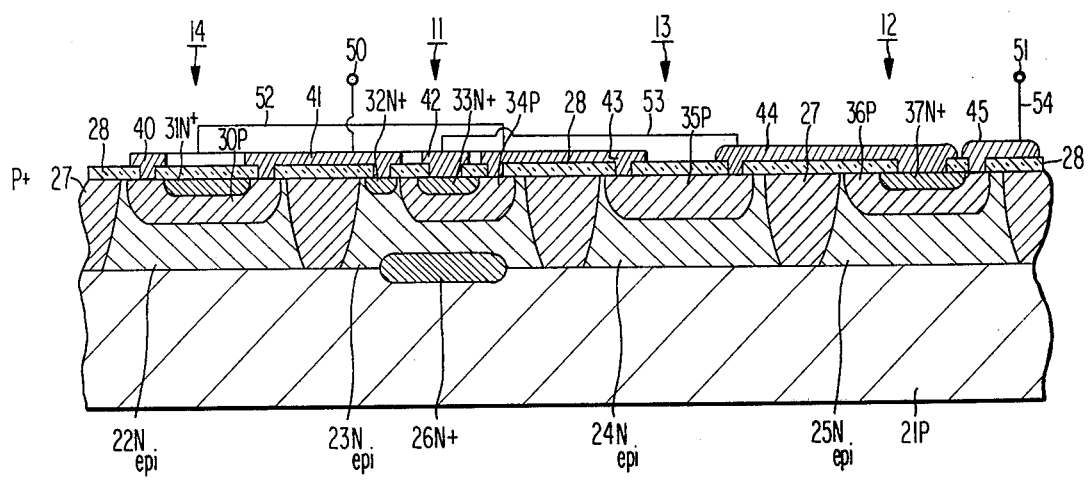
FIG. 5 is a cross-section view showing the preferred embodiment of the present invention shown in FIG. 3 as realized in a semiconductor integrated circuit.

Referring now to FIG. 1 which shows a constant voltage generator in the prior art, an NPN transistor 1 has its collector and base short-circuited to operate as a diode. This NPN transistor 1 and a Zener diode 2 are connected in series to each other. Between opposite terminals 3 and 4 of this series connection is obtained a constant voltage. Since such a constant voltage generator is simple in structure, it is widely used in the semiconductor integrated circuits in the prior art.

In such a constant voltage generator, since the Zener diode 2 has a positive temperature coefficient, the base-emitter forward voltage of the NPN transistor 2 has a negative temperature coefficient and they are connected in series to each other, the overall temperature coefficient of the circuit can be made zero by designing an impurity concentration or the like so as to equalize the absolute values of the temperature coefficients of the respective elements to each other. However, representing the Zener breakdown voltage of the Zener diode 2 by $V_z$ and its temperature coefficient by $\Delta V_z$, then there exists a proportional relationship shown in FIG. 2 between the breakdown voltage $V_z$ and the temperature coefficient $\Delta V_z$. Accordingly, in the case where the Zener breakdown voltage $V_z$ of the Zener diode 2 has deviated to the positive side with respect to the designed value due to manufacturing errors such that the predetermined impurity concentration and/or diffusion depth cannot be obtained, then the temperature coefficient $\Delta V_z$ becomes larger, and consequently the overall temperature coefficient of the constant voltage generator shown in FIG. 1 is increased on the positive side. On the contrary, in the case where the Zener breakdown voltage has deviated to the negative side with respect to the designed value, then the overall temperature coefficient of the constant voltage generator shown in FIG. 1 deviates to the negative side. Accordingly, in response to a variation of the Zener breakdown voltage due to manufacturing errors, the overall temperature coefficient of the constant voltage generator shown in FIG. 1 will vary and will deviate from "0" which should be maintained in the ideal case. Once a semiconductor integrated circuit has been manufactured, such a deviation of a temperature coefficient cannot be corrected. Consequently, in the case of IC's having a temperature coefficient standard of narrow allowance, extreme lowering of a production yield results, and stable production of the IC's is impossible.

In a semiconductor integrated circuit employing such a constant voltage generator, if provision is made such that the overall temperature coefficient of a constant voltage in the circuit may not vary even in the case that the Zener breakdown voltage $V_z$ of the Zener diode should have varied due to variations in the impurity diffusion condition, then the temperature coefficient will become constant regardless of the manufacturing errors, and so, the manufacturing conditions can be widely mitigated.

DESCRIPTION OF THE PREFERRED EMBODIMENTS

Referring now to FIG. 3 which shows one preferred embodiment of the present invention, a Zener diode 12 is connected to an emitter of an NPN transistor 11. The NPN transistor 11 and Zener diode 12 are formed on the same semiconductor substrate, and the Zener diode 12 has a cathode which has been formed by diffusion simultaneously with an emitter layer of the NPN transistor 11. In addition, between the base and emitter of the NPN transistor 11 is connected a first resistor 13 that is formed also by diffusion in a strip in the same semiconductor substrate simultaneously with the formation of the base layer of the NPN transistor 11, and further, between the base and collector of the NPN transistor 11 is also connected a second resistor 14 that is formed in the same semiconductor substrate simultaneously with the base and the emitter diffusions of the transistor 11. Here, the second resistor 14 is the so-called pinch resistor as disclosed in U.S. Pat. No. 3,404,321, which includes, as a resistive region, a strip-shaped diffusion layer of one conductivity type having a larger length than its width and formed simultaneously with the base layer diffusion of the NPN transistor 11, and which is provided with a diffusion layer of the opposite conductivity type formed by diffusion on the strip-shaped diffusion layer simultaneously with diffusion of the emitter layer of the NPN transistor 11 and covering all the strip-shaped diffusion layer except for its opposite end portions, the strip-shaped diffusion layer section between the opposite end portions being used as a high resistance resistor. In such a constant voltage generator, between terminals 10 and 15 is obtained a constant voltage equal to the sum of a voltage determined by the base-emitter forward bias voltage of the NPN transistor 11 and the ratio of resistances between the first and second resistors 13 and 14, and the Zener breakdown voltage of the Zener diode 12.

The above-mentioned constant voltage generator can be realized in a semiconductor integrated circuit as illustrated in cross-section in FIG. 5. In the manufacture of this semiconductor integrated circuit, an N-type high impurity concentration region 26 is formed at a predetermined portion in a semiconductor substrate 21 of P-type silicon. This predetermined portion corresponds to a portion on which an NPN transistor is formed later. On such a P-type semiconductor substrate 21 is formed by vapor deposition an N-type silicon epitaxial layer having a specific resistance of 0.4 ohm-cm (impurity concentration of $1.5 \times 10^{16}$ cm$^{-3}$), and in order to divide this epitaxial layer into island regions 22, 23, 24 and 25 which are electrically isolated from each other, P$^+$-type isolation diffusion regions 27 are formed through a diffusion process. The specific resistance of this epitaxial layer is selected at 0.1~1.5 ohm-cm. Thereafter, into the respective island regions 22, 23, 24 and 25 is diffused a P-type impurity at an impurity concentration of $10^{15} \sim 10^{19}$ cm$^{-3}$, for example, at $10^{18}$ cm$^{-3}$ to form P-type regions 30, 34, 35 and 36, respectively. Subsequently, an N-type impurity is diffused at an impurity concentration of $10^{16} \sim 10^{21}$ cm$^{-3}$ and at a higher concentration than the P-type regions 30, 34, 35 and 36, for example, in the above-exemplified case at $10^{20}$ cm$^{-3}$ to form N$^+$-type regions 31, 32, 33 and 37.

The NPN transistor 11 is composed of the island region 23, P-type region 34 and N$^+$-type region 33. The N$^+$ region 32 is a region for assuring ohmic contact when a collector electrode is led out from the island region 23 by a metal wiring layer. In this embodiment, the base-emitter voltage of the NPN transistor 11 is about 0.7 volts and has a temperature coefficient of −6000 ppm/°C. By inversely biasing the P-type region 36 and the N+-type region 37, the Zener diode 12 is formed. The Zener diode 12 is designed so that the Zener breakdown voltage may be 7 volts and the temperature coefficient may be +3.2 mV/°C. The first resistor 13 is formed by mounting two ohmic contact electrodes onto the P-type region 35. The second resistor 14 is formed of the P-type region 30 and the N+-type region 31 with two ohmic contact electrodes mounted on the P-type region 30 on the opposite sides of the N+-type region 31. In this embodiment, the resistances of the resistors 13 and 14 are respectively selected to be 1 kilo-ohms and 20 kilo-ohms.

On the epitaxial layer is provided an insulator film 28 of silicon dioxide having apertures for leading out electrodes. On said insulator film 28 are formed metallic wiring layers 40, 41, 42, 43, 44, 45, 52 and 53 which are wired with each other through said apertures, and thereby the circuit shown in FIG. 3 can be formed. Although the wiring layers 52 and 53 are represented by lines for convenience of illustration because they do not appear in the cross-section view, in practice they are formed on different surface portions of the insulator layer 28. Electrode terminals 50 and 51 corresponding to the terminals 10 and 15 in FIG. 3 are also formed on the insulator layer 28. In some cases, both the electrode terminals 50 and 51 are formed merely as a part of the wiring instead of taking the shape of terminals.

Since the thus formed Zener diode 12 and second resistor 14 are composed of regions to be formed in the same diffusion step, a certain correlation exists between the Zener breakdown voltage Vz of the Zener diode and the resistance value of the second resistor 14. The correlation is a mutually proportional relation as shown in FIG. 4. More particularly, variation of the Zener breakdown voltage of the Zener diode 12 is mainly caused by variation of the diffusion depth appearing in the heat treatment step in the diffusion process. If the diffusion depth of the N+-type regions 31 and 37 becomes deeper, then the Zener breakdown voltage is increased, and on the other hand the widths of the P-type regions 30 and 36 under the N+-type regions 31 and 37, respectively, are decreased, so that the resistance value of the second resistor 14 is increased. Also, on the contrary, even if the diffusion depths of the P-type regions 30 and 36 are increased, the resistance value of the second resistor 14 and the Zener breakdown voltage of the Zener diode 12 are increased because the impurity concentration in the P-type region 36 at the junction between the N+-type region 37 and the P-type region 36 is reduced, and on the other hand the impurity concentration in the P-type region 30 under the N+-type region 31 is reduced, so that the resistance value of the second resistor 14 and the Zener breakdown voltage of the Zener diode 12 are also increased. The graph in FIG. 4 showing the relation between the sheet resistance value of the second resistor 14 and the Zener breakdown voltage Vz of the Zener diode 12 was obtained by plotting the sheet resistance values and Zener breakdown voltages Vz measured with respect to about 80 samples manufactured under various conditions, and the results of measurements prove the validity of the above-described presumptions.

According to the present invention, a constant voltage having a fixed temperature coefficient can be obtained regardless of the manufacturing conditions of the semiconductor integrated circuits, by making use of the correlation between the second diffusion resistor 14 and the Zener diode 12 as shown in FIG. 4.

Representing the base-emitter voltage of the NPN transistor by $(V_{BE} - \Delta V_{BE} \cdot T)$, where T is a deviation of temperature from room temperature, the temperature coefficient of the base-emitter voltage being negative, the Zener breakdown voltage of the Zener diode 12 by $(V_z + \Delta V_z \cdot T)$, the resistance value of the first resistor 13 having a temperature coefficient of about 2000 ppm/°C. simply by $r_1$ for convenience because of its small resistance value, and the resistance value of the second resistor 14 having a temperature coefficient of about 6000 ppm/°C. by $(r_2 + \Delta r_2 \cdot T)$, then between the terminals 10 and 15 in FIG. 3 would appear a voltage V as represented by the following equation (1):

$$V = \frac{r_1 + (r_2 + \Delta r_2 \cdot T)}{r_1} (V_{BE} - \Delta V_{BE} \cdot T) + (V_z + \Delta V_z \cdot T) \qquad (1)$$

Therefore, if the resistance values of the resistors 13 and 14 are selected so that the amplified value of the decrement $(\Delta V_{BE} \cdot T)$ of the base-emitter voltage $V_{BE}$ of the NPN transistor 11 which is a function of the resistance increments $\Delta r_2$ of the second resistor 14 and the decrement $\Delta V_{BE}$ of the base-emitter voltage of the NPN transistor 11, may be equal to the increment $(\Delta V_z \cdot T)$ of the Zener breakdown voltage $V_z$ of the Zener diode 12, then the voltage V between the terminals 10 and 15 will become constant independent of the temperature. Since both the Zener breakdown voltage Vz of the Zener diode 12 and the resistance value $r_2$ of the second resistor 14 would vary in proportion to each other in response to variation of the diffusion condition, the temperature coefficient of the voltage V between the terminals 10 and 15 can be made zero regardless of the diffusion condition.

Explaining the above-mentioned effects in more a comprehensible manner, the base-emitter voltage of the NPN transistor has a negative temperature coefficient which has a small variation depending on the diffusion process. Accordingly, the collector-emitter voltage of the NPN transistor 11 also has a negative temperature coefficient given by a product of the base-emitter voltage temperature coefficient and the resistance ratio of the second resistor 14 to the first resistor 13. In the case where the Zener breakdown voltage of the Zener diode 12 has increased from the designed center value, because of the relation illustrated in FIG. 2, the temperature coefficient $\Delta V_z$ of the Zener breakdown voltage of the Zener diode 12 would increase to the positive side. Then, owing to the correlation illustrated in FIG. 4, the resistance value of the second resistor 14 becomes larger than its designed value, and accordingly, the absolute value of the temperature coefficient of the collector-emitter voltage of the NPN transistor is increased. Since the sign of the temperature coefficient of the base-emitter forward voltage of the NPN transistor 11 is negative, the temperature coefficient of the voltage V between the terminals 10 and 15 is kept constant by compensating the increment of the temperature coefficient of the Zener breakdown voltage by the increment of the resistance of the resistor 14. In other words, in the case where the Zener breakdown voltage Vz of the Zener diode 12 becomes larger than its designed value, the temperature coefficient ΔVz of the Zener breakdown voltage of the Zener diode 12 is increased to the positive side and the temperature coefficient of the collector-emitter voltage of the NPN transistor 11 is also increased to the negative side. Since the temperature coefficient of the stabilized voltage of the circuit shown in FIG. 3 is equal to the sum of the temperature coefficient of the collector-emitter voltage of the NPN transistor 11 and the temperature coefficient of the Zener breakdown voltage of the Zener diode 12, the stabilized voltage of the circuit shown in FIG. 3 can be maintained constant even if the Zener breakdown voltage of the Zener diode 12 is increased by appropriately selecting the circuit parameters. As a temperature coefficient of a constant voltage circuit is normally required to be "0", if the circuit is so designed that the temperature coefficient of the stabilized voltage of the circuit in FIG. 3 may be "0" when the Zener breakdown voltage Vz of the Zener diode 12 is at the center of the designed value, then the temperature coefficient of the stabilized voltage of the circuit in FIG. 3 can be maintained at "0" even if the Zener breakdown voltage Vz of the Zener diode 12 should be increased from the center of the designed value.

Now a second preferred embodiment of the present invention will be described with reference to FIG. 6 (a). An NPN transistor 61, a first resistor 63, a second resistor 64, a third resistor 65 and a Zener diode 62 are formed in the same semiconductor substrate. Between the base and emitter of the NPN transistor 61 is connected the first resistor 63 which employs only a P-type region formed simultaneously with diffusion of the base of the transistor 61 as a resistive region. Between the collector and base of the NPN transistor 61 are connected the second resistor 64 which employs a P-type region formed simultaneously with diffusion of the base and an N+-type region formed simultaneously with diffusion of the emitter, a portion of said P-type region under said N+-type being employed as a resistive region, and the third resistor 65 which employs only a P-type region formed simultaneously with the diffusion of the base, in parallel to each other. To the emitter of the NPN transistor 61 is connected the Zener diode 62 which employs a P-type region formed simultaneously with diffusion of the base of the NPN transistor 61 as an anode, and an N+-type region formed simultaneously with diffusion of the emitter of the NPN transistor 61 as a cathode. Then, a constant voltage which is independent of a temperature and a diffusion condition can be obtained between terminals 60 and 66.

The third resistor 65 is added in case where with only the first resistor 63 and the second resistor 64 it is difficult to reduce the temperature coefficient to zero and to obtain a constant voltage that is independent of the diffusion condition, and it serves to compensate for the variation of the resistance value of the second resistor 64 depending upon the diffusion condition and the temperature. If such a compensative resistor is employed, it is possible to obtain, between the terminals 60 and 66, a constant voltage that is almost completely independent of the diffusion condition and the temperature variation.

Figure 6A:
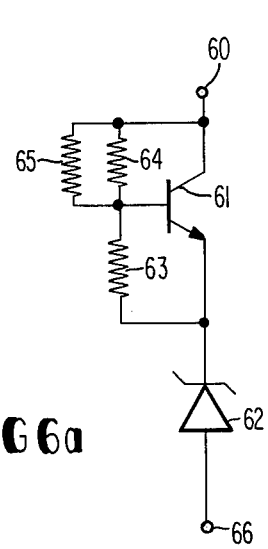
FIGS. 6(a) and 6(b) are circuit diagrams showing second and third preferred embodiments, respectively, of the present invention.
Figure 6B:
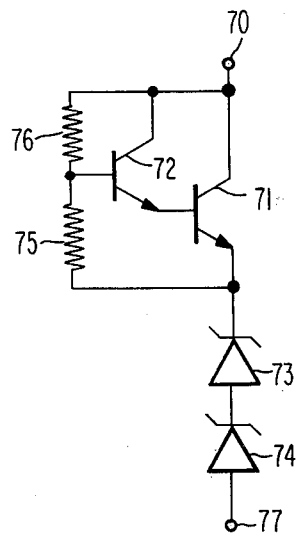

A third preferred embodiment of the present invention illustrated in FIG. 6 (b) affords an example in which a constant voltage obtained between terminals 70 and 77 is made to have a larger value. NPN transistors 71 and 72, Zener diodes 73 and 74, a first resistor 75 and a second resistor 76 are all formed simultaneously through two diffusion treatments in the same semiconductor substrate. The transistors 71 and 72 are connected in the so-called Darlington connection, so that across the first resistor 75 which is formed only by the base diffusion region is generated a voltage twice as large as the base-emitter voltage of these transistors. This voltage is amplified by the second resistor 76 which is formed of the base diffusion region and the emitter diffusion region as the so-called pinch resistor shown in FIG. 5 as the second resistor 14. Zener diodes are also serially connected, and so, between the terminals 70 and 77 is obtained a constant voltage that is larger than that in the preceding two preferred embodiments. In this third preferred embodiment also, similarly to the second preferred embodiment, it is an effective method for obtaining a more constant voltage to connect a compensative resistor 65 in parallel to the second resistor 76.

While a number of preferred embodiments of the present invention have been described above, it will be obvious for those skilled in the art that many changes and modifications could be made in these embodiments without departing from the spirit of the present invention. For example, the conductivity types of the semiconductors can all be reversed, the number of the transistors and Zener diodes can be arbitrarily increased, or the compensative resistor can be connected in series to the second resistor rather than in parallel thereto.

What is claimed is:

1. A constant voltage generator comprising:
   at least one transistor having a base, an emitter and a collector,
   a Zener breakdown voltage generator having at least one Zener diode and connected in series to a collector-emitter path of said transistor,
   a first resistor connected between said emitter and said base of said transistor, and
   a second resistor connected between said base and said collector of said transistor, said transistor, said Zener breakdown voltage generator and said first and second resistors being formed in a common semiconductor substrate, said first resistor composed of a first resistive region of only one conductivity type formed in said semiconductor substrate, and said second resistor composed of a second resistive region of said one conductivity type formed in said semiconductor substrate with at least a part of said second resistive region being covered with a region of the other conductivity type.

2. A constant voltage generator as claimed in claim 1, in which said transistor has a base region, an emitter region and a collector region formed in said semiconductor substrate, said Zener diode has an anode region and a cathode region formed in said semiconductor substrate, said base region of said transistor, said anode region of said Zener diode, said first resistive region of said first resistor, and said second resistive region of said second resistor have the same impurity concentration and the same depth, and said emitter region of said transistor, said cathode region of said Zener diode and said covering region of said second resistor have the same impurity concentration and the same depth.

3. A constant voltage generator comprising a semiconductor substrate of one conductivity type, an epitaxial layer of the other conductivity type formed on said semiconductor substrate, said epitaxial layer having first, second, third, and fourth island regions isolated electrically each other, first, second, third, and fourth regions of said one conductivity type formed in said first, second, third and fourth island regions respectively, fifth, sixth and seventh regions of said the other conductivity type formed in said first, second and fourth regions respectively, said third region composed of only one conductivity type and operating as a first resistor, said second island region, said second region and said sixth region operating as collector, base and emitter regions of a transistor respectively, said first region operating as a second resistor, said fourth region and said seventh region operating as a Zener diode, output terminals connected to said fourth region and said second island region, a first wiring connected between said second island region and one end of said first region, a second wiring connected between the other end of said first region, said second region and one end of said third region, and a third wiring connected between the other end of said third region, said sixth region and said seventh region.

4. A constant voltage generator as claimed in claim 1, further comprising a third resistor formed in said semiconductor substrate and connected in parallel with said second resistor, said second and third resistors having respective resistive regions of said one conductivity type formed simultaneously with the diffusion of another region of said one conductivity type which serves as the base of said transistor, said third resistor serving to compensate for the variation of the resistance value of said second resistor depending upon the diffusion condition and the temperature.

5. A constant voltage generator comprising:
   at least one transistor having a base, an emitter and a collector,
   a Zener breakdown voltage generator having at least one Zener diode and connected in series to a collector-emitter path of said transistor,
   a first resistor connected between said emitter and said base of said transistor,
   a second resistor connected between said base and said collector of said transistor, said transistor, said Zener breakdown voltage generator and said first and second resistors being formed in a common semiconductor substrate, said first resistor composed of a first resistive region of only one conductivity type formed in said semiconductor substrate, and said second resistor composed of a second resistive region of said one conductivity type formed in said semiconductor substrate with at least a part of said second resistive region being covered with a region of the other conductivity type, and
   a second transistor and a second Zener diode formed on said common semiconductor substrate, said second transistor having a base, an emitter and a collector and connected to said one transistor to form a Darlington pair, said second Zener diode being connected in series with said one Zener diode.

* * * * *